US006528405B1

(12) United States Patent
Martinez et al.

(10) Patent No.: US 6,528,405 B1
(45) Date of Patent: *Mar. 4, 2003

(54) ENHANCEMENT MODE RF DEVICE AND FABRICATION METHOD

(75) Inventors: Marino J. Martinez, Phoenix, AZ (US); Ernest Schirmann, Phoenix, AZ (US); Olin L. Hartin, Phoenix, AZ (US); Elizabeth C. Glass, Chandler, AZ (US); Julio C. Costa, Phoenix, AZ (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/506,844

(22) Filed: Feb. 18, 2000

(51) Int. Cl.[7] ...................... H01L 21/28; H01L 21/3205
(52) U.S. Cl. ................ 438/602; 438/285; 438/523; 257/192; 257/268; 257/280
(58) Field of Search .................. 438/602, 604, 438/285, 518, 523, 606; 257/200, 279, 289, 425, 631, 192, 268, 280, 194, 197

(56) References Cited

U.S. PATENT DOCUMENTS

| | | | |
|---|---|---|---|
| 4,662,058 A | 5/1987 | Cirillo, Jr. et al. | 29/571 |
| 4,729,000 A | 3/1988 | Abrokwah | 357/22 |
| 4,814,851 A | 3/1989 | Abrokwah et al. | 357/42 |
| 4,870,478 A | 9/1989 | Weitzel et al. | 357/22 |
| 5,060,031 A | 10/1991 | Abrokwah et al. | 357/22 |
| 5,404,032 A * | 4/1995 | Sawada et al. | 257/192 |
| 5,411,903 A | 5/1995 | Wu et al. | 437/41 |
| 5,429,986 A * | 7/1995 | Okada | 437/184 |
| 5,442,227 A * | 8/1995 | Fukaishi et al. | 257/628 |
| 5,444,016 A | 8/1995 | Abrokwah et al. | 437/184 |
| 5,480,829 A | 1/1996 | Abrokwah et al. | 437/57 |
| 5,488,237 A * | 1/1996 | Kuwata | 257/194 |
| 5,504,353 A * | 4/1996 | Kuzuhara | 257/194 |
| 5,512,518 A | 4/1996 | Cho et al. | 437/235 |
| 5,514,891 A | 5/1996 | Abrokwah et al. | 257/346 |
| 5,606,184 A | 2/1997 | Abrokwah et al. | 257/192 |
| 5,614,739 A | 3/1997 | Abrokwah et al. | 257/192 |
| 5,633,183 A * | 5/1997 | Swirhun | 438/285 |
| 5,693,544 A | 12/1997 | Abrokwah et al. | 437/36 |
| 5,796,131 A * | 8/1998 | Nakano et al. | 257/284 |
| 5,818,078 A * | 10/1998 | Makiyama et al. | 257/281 |
| 5,869,364 A * | 2/1999 | Nakano et al. | 438/167 |
| 5,949,095 A * | 9/1999 | Nagahara et al. | 257/192 |
| 5,949,096 A * | 9/1999 | Ohukobo et al. | 257/192 |
| 6,033,976 A * | 3/2000 | Murakami et al. | 438/602 |
| 6,103,614 A * | 8/2000 | Ahmari et al. | 438/606 |
| 6,172,384 B1 * | 1/2001 | Morikawa | 257/284 |

OTHER PUBLICATIONS

Wolf "Silicon Processing for the VLSI Era Volume 2: Process Integration" pp 298–304 and 354–359; Lattice Press; copyright 1990.*
N. Hara et al., Technical Digest (1998) IEEE GaAs IC Symposium, Atlanta, GA, "Current Path Optimized Structure for High Drain Current Density and High Gate–turn–on Voltage Enhancement Mode Heterostructure Field Effect Transistors" Nov. 1–4, 1998, pp. 198–201.

* cited by examiner

Primary Examiner—Olik Chaudhuri
Assistant Examiner—Fernando Toledo

(57) ABSTRACT

An enhancement mode RF device and method of fabrication includes a stack of compound semiconductor layers, including a central layer defining a device channel, a doped cap layer, and a buffer epitaxially grown on a substrate. Source and drain implant areas, extending at least into the buffer, are formed to define an implant free area in the device channel between the source and drain. Source and drain metal contacts are positioned on an upper surface of the central layer. Several layers of insulation and dielectric are positioned over the device and a gate opening is formed and filled with gate metal. During epitaxial growth, the doped cap layer is tailored with a thickness and a doping to optimize channel performance including gate-drain breakdown voltage and channel resistance.

23 Claims, 3 Drawing Sheets

ENHANCEMENT MODE RF DEVICE AND FABRICATION METHOD

FIELD OF THE INVENTION

This invention relates to enhancement mode RF devices and methods for fabrication.

More particularly, the present invention relates to enhancement mode RF devices with controlled channel resistance (ON resistance) and breakdown voltage and methods for fabrication which are compatible with other fabrication processes.

BACKGROUND OF THE INVENTION

One specific type of prior art enhancement mode device is fabricated by providing a wafer with a stack of compound semiconductor layers formed thereon to define a channel. Gate material is deposited on the stack and etched to form a gate overlying the channel. One problem here is that this type of gate formation requires lithographic techniques that seriously limit the size to which a gate can be reduced and, as is known in the art, the size of the gate dictates the operating frequencies. For example, in today's lithography the gate length has a lower limit of approximately 0.65 $\mu$m.

In this prior art fabrication process, the source and drain are next formed by standard implantation techniques (e.g. one or both of the source and drain are formed by a self-aligned process using the gate as a mask) and metal contacts are deposited on the surface of the upper compound semiconductor layer. The implantation in these prior art devices is performed to a depth to form the source and drain in the upper compound semiconductor layers (i.e. the channel layers). Care must be taken to ensure that surface dispersion or improper doping of the area in these layers adjacent to the gate does not occur, especially adjacent the gate on the drain side. This surface dispersion and the position of the source and drain contacts are variables which are difficult to control during fabrication.

Another specific type of prior art enhancement mode device is fabricated by providing a wafer with a stack of compound semiconductor layers, including a cap layer, formed thereon to define a channel. The cap layer is etched to define spaced apart source and drain areas which are implanted to form a source and a drain and the device is covered with a layer of dielectric material. The source and drain implanting is performed using standard photolithography. The dielectric layer is etched to allow deposition of metal in contact with the source and drain and the dielectric and cap layers are etched to define a gate area. Gate metallization is provided in the gate area to form a gate terminal in communication with the channel.

This second type of enhancement mode device has several drawbacks. First, the cap layer is not formed to create a depletion mode behavior in the access (source and drain) regions. Also, the source and drain implants, which are only into contact with the channel, are not deep enough for low access resistance. Further, the channel material, which is simply doped gallium arsenide, is not the best. A layer of aluminum gallium arsenide (AlGaAs) is deposited between the channel layer and the cap layer and the source and drain metal contacts are positioned on the AlGaAs layer, which results in less consistent contacts. Finally, there is less flexibility in the AlGaAs thickness and in the channel doping, which limits the ultimate performance. Thus, because of shallow implants and unoptimized channel material, it is difficult to reduce or minimize the channel resistance.

Accordingly it is highly desirable to provide enhancement mode RF devices which overcome these drawbacks and, in particular to provide enhancement mode RF devices with controlled channel resistance (ON resistance) and breakdown voltage. It is highly desirable to provide an improved method of fabrication which is compatible with other fabrication processes and which can provide mixed-mode integration if desirable.

BRIEF DESCRIPTION OF THE DRAWINGS

Referring to the drawings.

DESCRIPTION OF THE PREFERRED EMBODIMENT

Figure 1:
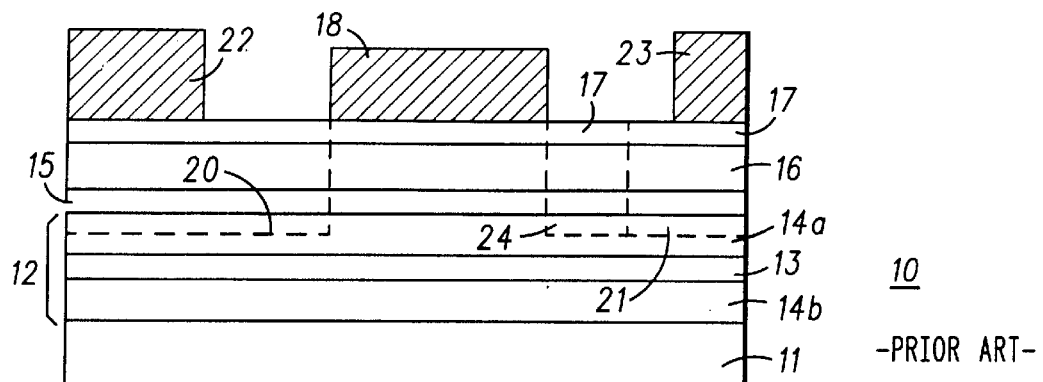
FIG. 1 is a simplified cross-sectional view of a prior art enhancement mode RF device.

Turning now to FIG. 1, a simplified cross-sectional view of a prior art enhancement mode RF device 10 is illustrated. Device 10 is formed on a wafer 11 and includes a buffer 12 formed on the upper surface of wafer 11. Buffer 12, in this specific embodiment, includes a first gallium arsenide (GaAs) layer 14a, a very thin layer of Si $\delta$-doping 13, and a second GaAs layer 14b. An indium gallium arsenide (InGaAs) channel layer 15 positioned on layer 14a of buffer 12. Here it is understood that GaAs layer 14b cooperates with InGaAs channel layer 15 as a portion of the device channel. Buffer 12 is included to isolate device 10 from the interface between wafer 11 and the epitaxial layers. An AlGaAs layer 16 is formed on InGaAs layer 15 and a very thin GaAs cap layer 17 is formed on AlGaAs layer 16.

A gate 18 is formed on AlGaAs cap layer 16 using standard technology, generally including the deposition of layers of contact semiconductor material and gate metal. The layers are then etched using standard lithography, which severely limits the gate length to approximately 0.65 $\mu$m or greater. Also, in many instances GaAs cap layer 17 is partially or totally etched away during etching of the gate layers, which adds to the inconsistency of the final device. Gate 18, upon completion, is then used in a self-aligned process as a mask for implanting a source 20. A drain 21 is generally implanted with a space 24 between the implant and gate 18, by any standard technique, such as photolithography or the like. The implants extend through AlGaAs cap layer 16 and InGaAs channel layer 15. Because the source side is self-aligned, an implant deep enough to reduce the access resistance will also extend under the gate and reduce the gate-source breakdown voltage. Also, a separate lower dose implant is performed in space 24 to control the gate-drain breakdown voltage. This additional implant in space 24 is difficult to control, e.g., the sheet resistance, due to the limited amount of charge necessary to maintain a high gate-drain breakdown voltage and the proximity of the implant to the surface. The proximity of the implant to the surface makes the sheet resistance in space 24 highly susceptible to minute changes in surface conditions. Because of these variables, the ON resistance can vary significantly and the gate-drain breakdown voltage also varies significantly. Metal source and drain ohmic contacts 22 and 23 are then formed on source 20 and drain 21, respectively, in a well known fashion.

It has been found through extensive studies that the combination of the proximity to the surface of the implant in space 24 and variations in implant dosage and activation, as well as surface conditions, produce a highly variable ON resistance. Also, because of the number of variables in the fabrication process, it is not a stable process and there can be substantial variation in finished devices. Further, because of the specific etched gate process used, gate 18 is not easily scalable to smaller lengths (i.e. the gate length is limited by standard photolithographic techniques).

Figure 2:
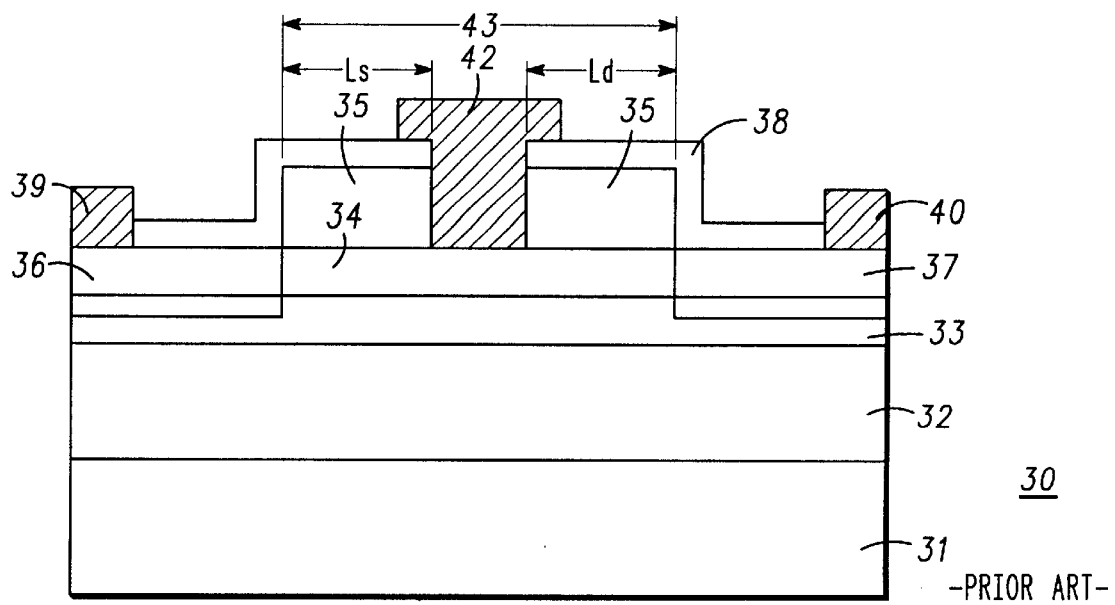
FIG. 2 is a simplified cross-sectional view of another prior art enhancement mode RF device.

Turning now to FIG. 2, a simplified cross-sectional view of another prior art enhancement mode RF device 30 is illustrated. Device 30 is formed on a wafer 31 and includes a buffer layer 32 formed on the upper surface of wafer 31. A doped gallium arsenide (GaAs) channel layer 33 is formed on buffer layer 32, an aluminum gallium arsenide (AlGaAs) layer 34 is formed on GaAs channel layer 33, and a gallium arsenide (GaAs) cap layer 35 is formed on AlGaAs layer 34. GaAs cap layer 35 is etched to define source and drain areas 36 and 37, respectively. Source and drain areas 36 and 37 are spaced from the gate area a distance $L_s$ and $L_d$, respectively. Source and drain areas 36 and 37 are then implanted, using GaAs cap layer 35 as a mask (and additional standard mask layers if desired) to form the source and drain. The implants for source and drain areas 36 and 37 are relatively shallow and only extend through AlGaAs layer 34 and slightly into GaAs channel layer 33. These shallow implants result in increased sheet resistance in source and drain areas 36 and 37. A SiON layer 38 is deposited over the entire device and etched, exposing the implants in source area 36 and drain area 37, to define source and drain contact areas. Metal is deposited in the etched areas to form a source ohmic contact 39 and a drain ohmic contact 40. Also, an opening is etched through SiON layer 38 and GaAs cap layer 35 to expose the surface of AlGaAs layer 34 and metal 42 is deposited in the etched opening to form a gate and gate contact. Here it should be noted that AlGaAs layer 34 is formed with 50% AlAs, which has the disadvantages of reducing the electrical barrier between the gate contact and the channel layer and reducing the positive voltage that can be applied to the gate.

This enhancement mode device has several drawbacks. First, GaAs cap layer 35 is not doped. Because cap layer 35 is undoped, the sheet resistance in spaces $L_s$ and $L_d$ suffer from surface depletion, which increases sheet resistance severely, leading to higher device ON resistance. Also, source and drain implants 36 and 37 are only in contact with the upper surface of AlGaAs layer 34, which is not deep enough for low access resistance. Further, the source and drain metal contacts 39 and 40 are positioned on AlGaAs layer 34, which results in less consistent contacts. The channel material, which is simply doped gallium arsenide (i.e. GaAs channel layer 33), is not the best channel material. To maintain depletion mode conditions throughout $L_s$ and $L_d$, the doping in channel layer 33 must be relatively high. High doping in channel layer 33 results in a high leakage current, which means that this device cannot be used as a true enhancement mode device. Finally, there is less flexibility in the thickness of AlGaAs layer 34 and in the doping of GaAs channel layer 33 which limits the ultimate performance.

Figure 3:
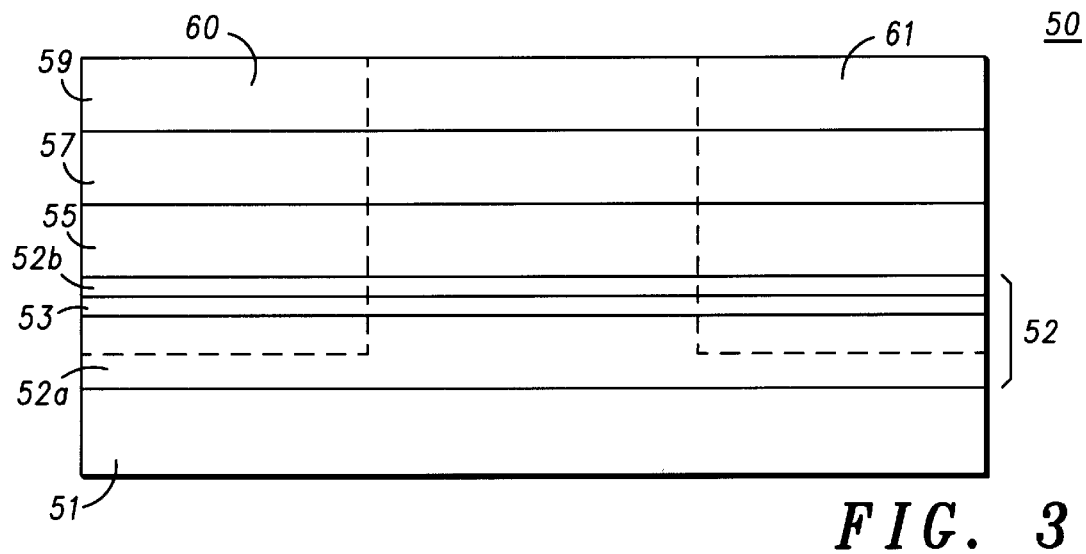
FIGS. 3, 4, and 5 are simplified cross-sectional views illustrating sequential steps in a fabrication process of an enhancement mode RF device in accordance with the present invention.

Turning now to FIG. 3, a simplified cross-sectional view illustrates an initial step in a fabrication process of an enhancement mode RF device 50 in accordance with the present invention. Device 50 includes a substrate 51 having a stack of compound semiconductor layers formed thereon. In this specific embodiment, substrate 51 is formed of gallium arsenide (GaAs) and a buffer 52, including a GaAs layer 52a, a thin layer 53 of Si δ-doping, and a GaAs layer 52b, is epitaxially grown on the upper surface thereof. A central layer 55 of indium gallium arsenide (InGaAs), which generally defines the device channel, is epitaxially grown on buffer 52. Here it should be understood that layer 55 is referred to as the "central" layer because different embodiments or different applications might include different numbers or types of layers of compound semiconductor material in the stack. The InGaAs in central layer 55 is specifically selected to produce some crystallographic strain in central layer 55 and includes high indium arsenide content to improve carrier mobility in the device channel and, thereby, reduce the ON resistance. An aluminum gallium arsenide (AlGaAs) layer 57, including 75% aluminum arsenide and 25% GaAs, is epitaxially grown on InGaAs central layer 55 and a doped GaAs cap layer 59 is epitaxially grown on AlGaAs layer 57. Here it will be understood that other similar wide bandgap material may be used in place of the AlGaAs, such as InGaP, GaN, or the like. Also, as will be explained in more detail presently, specific combinations of doping and thickness of GaAs cap layer 59 can be used to control both the gate-to-drain breakdown voltage ($BV_{GDO}$) and the channel sheet resistance ($R_{SH}$) adjacent to the gate.

With substrate 51 and the stack of compound semiconductor layers formed as described, GaAs cap layer 59 is masked using any appropriate technology and source and drain implants 60 and 61 (illustrated by broken lines) are introduced into the stack of compound semiconductor layers and buffer 52. Here it should be specifically noted that implants 60 and 61 extend at least through InGaAs central layer 55, and preferably extend into GaAs layer 52a of buffer 52. Because of the relatively large size and spacing of implants 60 and 61 masking is very easy and may not be required in some specific applications. Implants 60 and 61 are spaced apart to define an implant (and doping) free area in InGaAs central layer 55 and AlGaAs layer 57 (also, buffer 52 and substrate 51) therebetween. In this specific embodiment, GaAs cap layer 59 is doped for n conductivity and implants 60 and 61 are heavily doped (n+) with n-type material.

Figure 4:
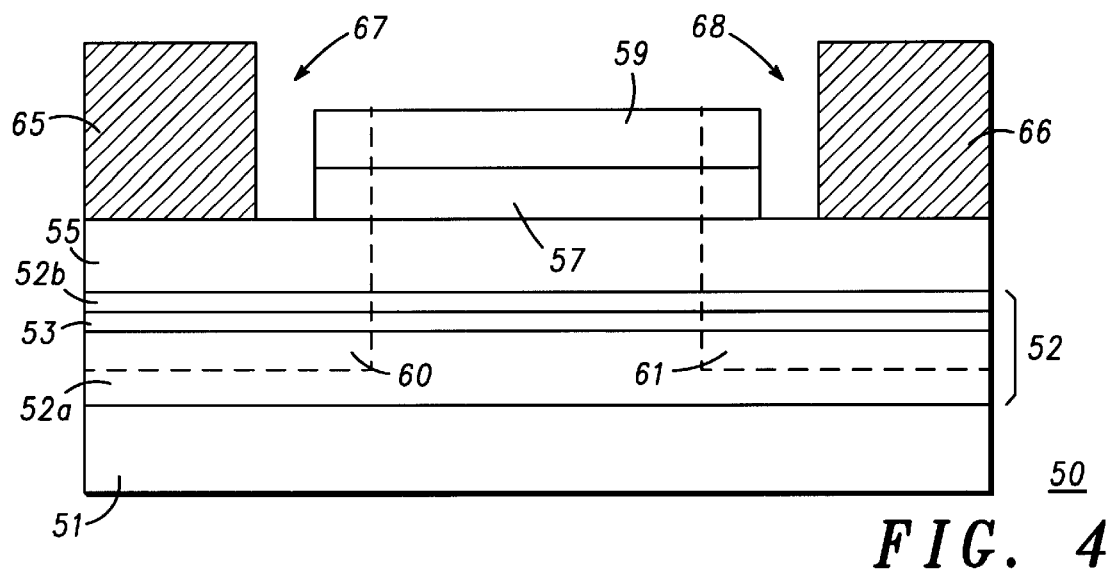

The stack of compound semiconductor layers is then etched, as illustrated in FIG. 4, using standard lithographic techniques, through GaAs cap layer 59 and AlGaAs layer 57 to approximately the upper surface of InGaAs central layer 55 within implants 60 and 61 to form source contact area 63 and drain contact area 64. In some applications it may be acceptable to only etch through GaAs cap layer 59 to the surface of AlGaAs layer 57 to form source contact area 63 and drain contact area 64. Metal is deposited in source contact area 63 and drain contact area 64 to form ohmic electrical contacts 65 and 66 on InGaAs central layer 55 in source contact area 63 and drain contact area 64. It should be noted that in this preferred embodiment the etched contact areas 63 and 64 are slightly larger than ohmic electrical contacts 65 and 66 so as to define a trench or insulation space, designated 67 and 68, between doped cap layer 59 and each ohmic electrical contact 65 and 66.

Here it should be specifically noted that doped cap layer 59 is in electrical contact with implants 60 and 61 (inside of trenches 67 and 68) but is not in direct communication with ohmic electrical contacts 65 and 66. This particular configuration improves the breakdown voltage (especially the gate to drain breakdown voltage) and substantially reduces the leakage current by creating a depletion mode behavior in the area beneath trenches 67 and 68.

Figure 5:
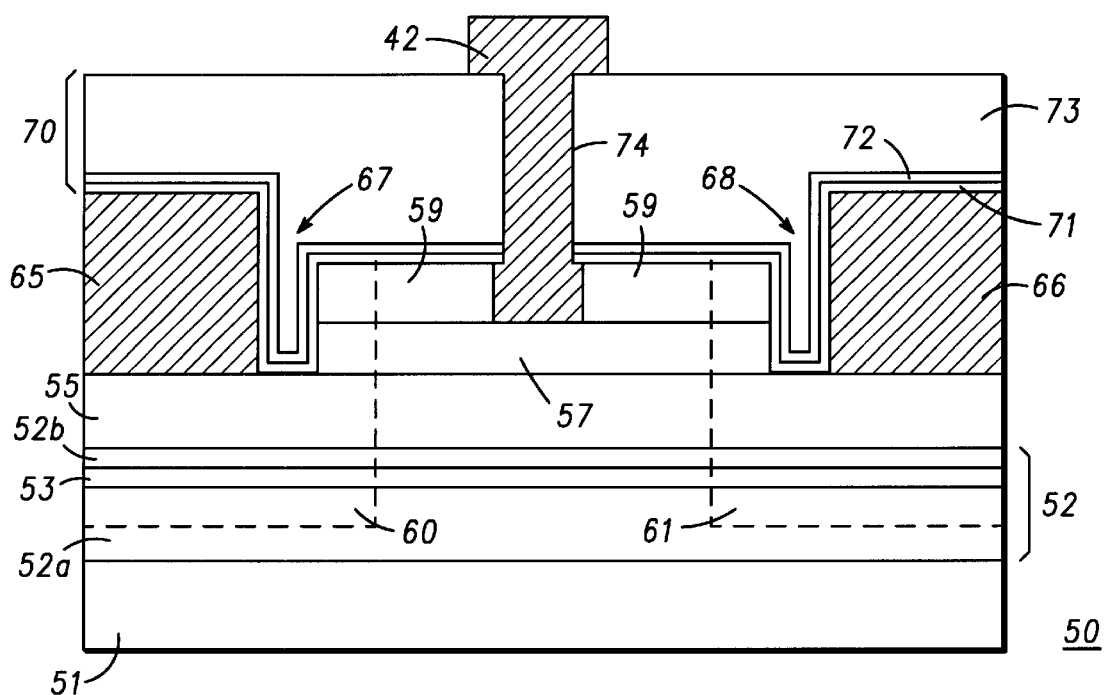

Turning now to FIG. 5, a device insulation structure, generally designated 70, is formed by deposition over ohmic electrical contacts 65 and 66, within insulation spaces 67 and 68 in the source contact area 53 and the drain contact area 64, and on cap layer 59 overlying the implant free area. In this preferred embodiment, insulation structure 70 includes a first thin layer of silicon nitride ($Si_3N_4$) 71, a second thin layer of aluminum nitride (AlN) 72, and a relatively thick insulating layer of TEOS 73. It should be noted that FIG. 5 is not drawn to scale but is illustrated to provide the best understanding. As an example of sizes in this specific embodiment, InGaAs central layer 55 is approximately 150 angstroms thick, AlGaAs layer 57 is approximately 250 angstroms thick, doped GaAs cap layer 59 is approximately 400 angstroms thick, silicon nitride layer 71 is approximately 200 angstroms thick, aluminum nitride layer 72 is approximately 200 angstroms thick, and TEOS layer 73 is approximately 3000 angstroms thick. Also, while metal contacts 65 and 66 will be much thicker than AlGaAs layer 57 and GaAs cap layer 59, they are shown slightly larger for convenience in understanding the structure.

A gate opening 74 is defined using a standard photo resist (not shown) and a combination of wet and dry etch processes is used to etch an opening through insulation structure 70 to the upper surface of cap layer 59. Here it will be understood by those skilled in the art that because of the relatively large size or length of gate opening 74 standard lithographic masking and etching techniques can be used. Specific details as to a preferred etching process of the layers in insulation structure 70 can be found in U.S. Pat. No. 5,484,740, entitled "Method of Manufacturing a III–V Semiconductor Gate Structure", issued Jan. 16, 1996 and U.S. Pat. No. 5,619,064, entitled "III–V Semiconductor Gate Structure and Method of Manufacture", issued Apr. 8, 1997, both of which are included herein by reference. During this etching process, AlN layer 72 can be used as an etch stop layer within gate opening 74.

It should be briefly noted that TEOS layer 73 is anisotropically etched to initially define gate opening 74, after which the photoresist can be removed and TEOS layer 73 used as an etch mask. Also, AlN layer 72 operates as an etch stop for the etching of TEOS layer 73. AlN layer 72 is then etched in a wet chemical etch with $Si_3N_4$ layer 71 providing protection against undue damage to cap layer 59. Again it should be briefly noted that the etching of AlN layer 72 is nearly vertical or anisotropic to provide a very well defined gate opening 74. $Si_3N_4$ layer 71 is then etched using a "gentle" reactive ion etch to expose the surface of GaAs cap layer 59. Etching $Si_3N_4$ layer 71 produces a slight undercut of AlN layer 72 which does not cause a problem in defining gate opening 74. Using insulation structure 70 as an etch mask, at least some of the compound semiconductor stack (in this embodiment, cap layer 59) is etched to expose an upper surface of AlGaAs layer 57.

Gate opening 74 is spaced from source contact area 63 and drain contact area 64 distances which are derived in a well known manner to provide desired characteristics (e.g. breakdown and operating voltages, etc.) for device 50. For example, in one specific embodiment of the present invention source implant 60 is implanted adjacent to gate opening 74 (potentially by a self-aligned method) while drain implant 61 is spaced an appropriate distance from gate opening 74. This again is a relatively simple mask and etch procedure. Etched gate opening 74 is then filled with gate contact metal (e.g. by sputtering or the like) to form a gate contact 75.

While the various steps have been described in a specific sequence, it should be understood by those skilled in the art that any convenient sequence of steps can be used to fabricate device 50 and the sequence described herein and claimed below is not intended in any way to limit the process.

Because AlGaAs layer 57 includes 75% AlAs, an improved barrier is formed between gate contact 75 and the device channel, i.e. InGaAs central layer 55. Here it should be noted that the thickness of AlGaAs layer 57 can be changed (e.g., reduced) and the amount of doping of Si δ-doping layer 53 can be adjusted to modify the transconductance (Gm) and the threshold of device 50. Further, because GaAs cap layer 59 is easily modified in both thickness and doping, specific combinations of doping and thickness can be derived to control both the gate-to-drain breakdown voltage ($BV_{GDO}$) and the channel sheet resistance ($R_{SH}$) adjacent to the gate. These potential design changes add more design freedom to the novel fabrication method disclosed.

Thus, by providing the strained InGaAs channel layer 55 and an undoped channel, carrier mobility in the channel is substantially improved and series resistance is improved. The source and drain ohmic electrical contacts 65 and 66 are in electrical contact with InGaAs channel layer 55 so that they are deep enough for low access resistance and also form consistent contacts with the InGaAs (rather than the inconsistent contacts formed with AlGaAs in the prior art). Because of the doped cap layer and the undoped channel layer, depletion mode behavior in the contact access regions is created and the leakage current is low enough to provide true enhancement mode operation of device 50. Thus, a new and improved enhancement mode RF device is disclosed along with new and improved methods of fabrication.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating an enhancement mode RF device comprising the steps of:

providing a substrate having a stack of compound semiconductor layers formed thereon including a cap layer, a central layer defining a device channel, and a buffer adjacent the substrate;

after providing the substrate having a stack of compound semiconductor layers, implanting a source and a drain in the stack of semiconductor layers, the source and drain extending at least into the buffer and defining an implant free area in the device channel between the source and drain;

after implanting the source and the drain, etching the stack of compound semiconductor layers at the source and drain to form source contact and drain contact areas;

after etching the stack of compound semiconductor layers to form source contact and drain contact areas, depositing electrical contacts on the central layer in the source contact area and the drain contact area;

after depositing electrical contacts on the central layer, in any sequence, forming a device insulation structure over the implant free area and etching a gate opening through the device insulation structure and the cap layer of the stack of compound semiconductor layers in the implant free area, the gate opening being spaced from the source contact area and the drain contact area; and after etching the gate opening through the device insulation structure, depositing gate metal in the gate opening to form a gate contact.

2. A method of fabricating an enhancement mode RF device as claimed in claim 1 wherein the step of providing the substrate having the stack of compound semiconductor layers includes forming the cap layer of a doped compound semiconductor material.

3. A method of fabricating an enhancement mode RF device as claimed in claim 2 wherein the step of forming the cap layer of the doped compound semiconductor material includes tailoring the cap layer with a thickness and a doping to optimize channel performance including gate-drain breakdown voltage and channel resistance.

4. A method of fabricating an enhancement mode RF device as claimed in claim 1 wherein the step of providing the substrate having the stack of compound semiconductor layers includes providing a gallium arsenide substrate, the buffer on the substrate, an indium gallium arsenide layer on the buffer forming the central layer, a wide bandgap layer on the indium gallium arsenide layer, and a doped gallium arsenide layer on the wide bandgap layer forming the cap layer.

5. A method of fabricating an enhancement mode RF device as claimed in claim 4 wherein the step of providing the wide bandgap layer on the indium gallium arsenide layer includes providing an aluminum gallium arsenide layer on the indium gallium arsenide layer.

6. A method of fabricating an enhancement mode RF device as claimed in claim 5 wherein the step of providing the aluminum gallium arsenide layer on the indium gallium arsenide layer includes providing an aluminum gallium arsenide layer including approximately 75% aluminum arsenide.

7. A method of fabricating an enhancement mode RF device as claimed in claim 4 wherein the step of providing the buffer on the substrate includes providing a buffer comprising at least one gallium arsenide layer formed on the substrate and a thin Si δ-doped layer formed within the gallium arsenide layer.

8. A method of fabricating an enhancement mode RF device as claimed in claim 7 wherein the steps of providing the thin Si δ-doped layer formed within the gallium arsenide layer and the wide bandgap layer on the indium gallium arsenide layer includes adjusting the thickness of the wide bandgap layer on the indium gallium arsenide layer and a doping amount of the thin Si δ-doped layer to adjust transconductance and threshold of the enhancement mode RF device.

9. A method of fabricating an enhancement mode RF device as claimed in claim 1 wherein the step of depositing electrical contacts on the central layer includes spacing the electrical contacts from the cap layer so as to define an insulation space between the cap layer and the electrical contacts in the source contact area and the drain contact area.

10. A method of fabricating an enhancement mode RF device as claimed in claim 9 wherein the step of forming a device insulation structure includes filling the insulation space between the cap layer and the electrical contacts in the source contact area and the drain contact area.

11. A method of fabricating an enhancement mode RF device as claimed in claim 1 wherein the step of forming the device insulation structure includes depositing layers of silicon nitride and aluminum nitride and a relatively thick layer of dielectric material and the step of etching the gate opening through the device insulation structure includes using the aluminum nitride layer as an etch stop.

12. A method of fabricating an enhancement mode RF device as claimed in claim 1 wherein the step of providing the substrate having the stack of compound semiconductor layers includes epitaxially growing the stack of compound semiconductor layers on the substrate.

13. A method of fabricating an enhancement mode RF device as claimed in claim 12 wherein the step of epitaxially growing the stack of compound semiconductor layers includes growing the central layer with crystallographic strain.

14. A method of fabricating an enhancement mode RF device comprising the steps of:

providing a substrate having a stack of compound semiconductor layers epitaxially formed thereon including a doped cap layer with a specific thickness, a central layer defining a device channel, and a buffer formed on the substrate, the doping and thickness of the cap layer at least partially determining gate-drain breakdown voltage and channel resistance of the device;

after providing the substrate having a stack of compound semiconductor layers, implanting a source and a drain in the stack of semiconductor layers, the source and drain extending at least into the buffer and defining an implant free area in the device channel between the source and drain;

after implanting the source and the drain, etching the stack of compound semiconductor layers to the central layer at the source and drain to form source contact and drain contact areas;

after etching the stack of compound semiconductor layers to form source contact and drain contact areas, depositing metal ohmic contacts on the central layer in the source contact area and the drain contact area;

after depositing electrical contacts on the central layer, in any sequence, forming a device insulation structure over the implant free area and etching a gate opening through the insulation structure and the cap layer of the stack of compound semiconductor layers in the implant free area, the gate opening being spaced from the source contact area and the drain contact area; and after etching the gate opening through the device insulation structure, depositing gate metal in the gate opening to form a gate contact.

15. A method of fabricating an enhancement mode RF device as claimed in claim 14 wherein the step of providing the substrate having the stack of compound semiconductor layers includes providing a gallium arsenide substrate, the buffer on the substrate, an indium gallium arsenide layer on the buffer forming the central layer, a wide bandgap layer on the indium gallium arsenide layer, and a doped gallium arsenide layer on the wide bandgap layer forming the cap layer.

16. A method of fabricating an enhancement mode RF device as claimed in claim 15 wherein the stack of compound semiconductor layers are epitaxially formed to include crystallographic strain in the indium gallium arsenide layer.

17. A method of fabricating an enhancement mode RF device as claimed in claim 15 wherein the step of providing the wide bandgap layer on the indium gallium arsenide layer includes providing an aluminum gallium arsenide layer on the indium gallium arsenide layer.

18. A method of fabricating an enhancement mode RF device as claimed in claim 17 wherein the step of providing the aluminum gallium arsenide layer on the indium gallium arsenide layer includes providing an aluminum gallium arsenide layer including approximately 75% aluminum arsenide.

19. A method of fabricating an enhancement mode RF device as claimed in claim 15 wherein the step of providing the buffer on the substrate includes providing a buffer comprising a gallium arsenide layer formed on the substrate and a thin Si δ-doped layer formed within the gallium arsenide layer formed on the substrate.

20. A method of fabricating an enhancement mode RF device as claimed in claim 19 wherein the steps of providing the thin Si δ-doped layer formed within the gallium arsenide layer and providing the wide bandgap layer on the indium gallium arsenide layer includes adjusting the thickness of the wide bandgap layer on the indium gallium arsenide layer and a doping amount of the thin Si δ-doped layer to adjust transconductance and threshold of the enhancement mode RF device.

21. A method of fabricating an enhancement mode RF device as claimed in claim 14 wherein the step of depositing metal contacts on the central layer includes spacing the metal contacts from the cap layer so as to define an insulation space between the cap layer and the metal contacts in the source contact area and the drain contact area.

22. A method of fabricating an enhancement mode RF device as claimed in claim 21 wherein the step of forming the device insulation structure includes filling the insulation space between the cap layer and the metal contacts in the source contact area and the drain contact area.

23. A method of fabricating an enhancement mode RF device as claimed in claim 14 wherein the step of forming the device insulation structure includes depositing layers of silicon nitride and aluminum nitride and a relatively thick layer of dielectric material and the step of etching the gate opening through the device insulation structure includes using the aluminum nitride layer as an etch stop.

* * * * *